US012813109B2

(12) United States Patent
Du et al.

(10) Patent No.: US 12,813,109 B2
(45) Date of Patent: Nov. 24, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventors: Minchen Du, Wuhan (CN); Shaojing Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 356 days.

(21) Appl. No.: 18/579,378

(22) PCT Filed: Dec. 11, 2023

(86) PCT No.: PCT/CN2023/137794
§ 371 (c)(1),
(2) Date: Jan. 15, 2024

(87) PCT Pub. No.: WO2025/112104
PCT Pub. Date: Jun. 5, 2025

(65) Prior Publication Data
US 2025/0234724 A1 Jul. 17, 2025

(30) Foreign Application Priority Data
Nov. 30, 2023 (CN) ......................... 202311640360.3

(51) Int. Cl.
*H10K 59/131* (2023.01)

(52) U.S. Cl.
CPC .................................. *H10K 59/131* (2023.02)

(58) Field of Classification Search
CPC ............................. H10K 59/131; H10K 59/88
See application file for complete search history.

(56) References Cited

U.S. PATENT DOCUMENTS 11,011,553 B2 * 5/2021 Cui ...................... G02F 1/1345
2019/0278145 A1 * 9/2019 Tanaka ............. G02F 1/136286
(Continued)

FOREIGN PATENT DOCUMENTS

CN 107784936 A * 3/2018 ........... G09G 3/2092
CN 108598088 9/2018
(Continued)

OTHER PUBLICATIONS

Notification of Office Action and Search Report Dated Dec. 31, 2004 From The State Intellectual Property Office of the People's Republic of China Re. Application No. 202311640360.3 and Its Translation Into English. (13 Pages).
(Continued)

*Primary Examiner* — Mohammed Shamsuzzaman

(57) ABSTRACT

A display panel and a display device are provided. A first entity portion is connected with a data line and a signal trace, and a first gap is provided between the first entity portion and a first dummy portion. The display panel includes a first metal layer and a second metal layer that are stacked. The first entity portion includes a first portion located on the first metal layer. The first dummy portion includes a third portion located on the first metal layer. The first portion includes a first end of the first entity portion, and the third portion includes a first end of the first dummy portion.

20 Claims, 4 Drawing Sheets

(56) References Cited

U.S. PATENT DOCUMENTS

| | | | | |
|---|---|---|---|---|
| 2023/0161427 | A1 | 5/2023 | Fan et al. | |
| 2023/0352391 | A1 * | 11/2023 | Mi | H10D 86/441 |
| 2024/0045541 | A1 | 2/2024 | Zhang et al. | |
| 2024/0114737 | A1 * | 4/2024 | Yue | H10K 59/131 |
| 2024/0224636 | A1 * | 7/2024 | Long | H10K 59/131 |
| 2025/0143105 | A1 * | 5/2025 | Du | H10K 59/131 |

FOREIGN PATENT DOCUMENTS

| | | | | | |
|---|---|---|---|---|---|
| CN | 109148485 | A | * | 1/2019 | H10D 86/60 |
| CN | 109541865 | | | 3/2019 | |
| CN | 109541865 | A | * | 3/2019 | G02F 1/136286 |
| CN | 104952883 | B | * | 4/2019 | G09G 3/20 |
| CN | 109791745 | | | 5/2019 | |
| CN | 112310152 | A | * | 2/2021 | G09F 9/335 |
| CN | 108254984 | B | * | 6/2021 | H10D 86/481 |
| CN | 114690921 | | | 7/2022 | |
| CN | 114864640 | A | * | 8/2022 | H10K 59/88 |
| CN | 114999378 | | | 9/2022 | |
| CN | 115528075 | A | * | 12/2022 | G09F 9/335 |
| CN | 116096172 | | | 5/2023 | |
| CN | 116456771 | | | 7/2023 | |
| CN | 116456773 | A | * | 7/2023 | H10K 59/131 |
| CN | 116528618 | | | 8/2023 | |
| CN | 116669485 | | | 8/2023 | |
| CN | 116997215 | A | * | 11/2023 | H10K 59/131 |
| KR | 10-2021-0051971 | | | 5/2021 | |
| WO | WO-2018062023 | A1 | * | 4/2018 | G09G 3/3677 |
| WO | WO-2023142404 | A1 | * | 8/2023 | H10D 86/60 |

OTHER PUBLICATIONS

International Search Report and the Written Opinion Dated Jun. 11, 2024 From the International Searching Authority Re. Application No. PCT/CN2023/137794 and Its Translation Into English. (17 Pages).

* cited by examiner

DISPLAY PANEL AND DISPLAY DEVICE

RELATED APPLICATIONS

This application is a National Phase of PCT Patent Application No. PCT/CN2023/137794 having International filing date of Dec. 11, 2023, which claims the benefit of priority of China Patent Application No. 202311640360.3 filed on Nov. 30, 2023. The contents of the above applications are all incorporated by reference as if fully set forth herein in their entirety.

TECHNICAL FIELD

The present application relates to the field of display technologies, and more particularly, to a display panel and a display device.

BACKGROUND

An Organic Light-Emitting Diode (referred briefly to as OLED) display panel has the advantages of being lighter and thinner, good in display effect, high in resolution, wide in color gamut, lower in power consumption, and capable of realizing flexible display, compared with liquid crystal display, so that it has been rapidly developed in recent years and has become a preferred display panel type in mobile terminals.

Currently, in order to achieve the effect of a narrow frame, a display structure of a Fanout in Active Area (referred briefly to as FIAA), that is wiring in the display region, is used. The FIAA traces (for example, a fanout trace (also referred to as a fanout line), but may not have a fan-shaped planar form) are used for connecting data lines and signal lines, and generally include transverse connection lines and longitudinal connection lines. Currently, in order to reduce the production and the manufacturing cost of a display panel, and to simplify a process flow, the display panel is simplified from three source-drain metal layers to two source-drain metal layers, and the transverse connection lines and the longitudinal connection lines are provided in the two source-drain metal layers, so that the vertical distance between the transverse connection line and the anode, the vertical distance between the longitudinal connection line and the anode are shortened.

Because of the layout design of the display region, the transverse connection lines and the longitudinal connection lines should be arranged in different metal film layers, and each transverse connection line and each longitudinal connection line are electrically connected to only a corresponding one data line, so that each transverse connection line needs to form a break (or a gap, the transverse connection line is divided into two parts at the break), and each longitudinal connection line needs to form a break. The breaks on transverse connection lines are linearly arranged, and the breaks on longitudinal connection lines are linearly arranged. Because the breaks are located in the display region, a linear Mura (English full name: Mura) is generated in the display panel in a screen off state of the display panel, and thus the screen-off mura problem is caused, which is urgently to be solved.

SUMMARY

The present application provides a display panel and a display device, which can effectively solve the problem of screen-off mura existing in an OLED display panel with an existing FIAA structure.

According to a first aspect, a display panel is provided by the application and includes a display region provided with a plurality of data lines and a plurality of first connection lines, and a non-display region provided with a plurality of signal traces; the data lines and the first connection lines being intersected; in which the first connection lines include respective first entity portions and respective first dummy portions, each of the first entity portion and a corresponding one of the first dummy portions are spaced apart; each of the first entity portions is electrically connected to a corresponding one of the data lines and a respective one of the signal traces, each of the first dummy portions is electrically insulated from a corresponding one of the first entity portions, and each of first gaps is provided between a first end of a corresponding one of the first entity portions and a first end of a respective one of the first dummy portions; in which the display panel includes a substrate, and a first metal layer and a second metal layer sequentially stacked on the substrate, the display panel further includes a plurality of thin film transistors, and at least one of a source and a drain of each of the thin film transistors is located on the second metal layer; in which the first entity portion includes a first portion located on the first metal layer, the first dummy portion includes a third portion located on the first metal layer, and the first portion includes the first end of the first entity portion, and the third portion includes the first end of the first dummy portion.

According to a second aspect, the present application provides a display device including a housing and any one of the above mentioned display panels, in which the housing includes an accommodative space in which the display panel is provided.

BRIEF DESCRIPTION OF THE DRAWINGS

In order that the technical solution in the embodiments of the present application may be explained more clearly, reference will now be made briefly to the accompanying drawings required for the description of the embodiments. It will be apparent that the accompanying drawings in the following description are merely some of the embodiments of the present application, and other drawings may be made to those skilled in the art without involving any inventive effort.

Figure 1:
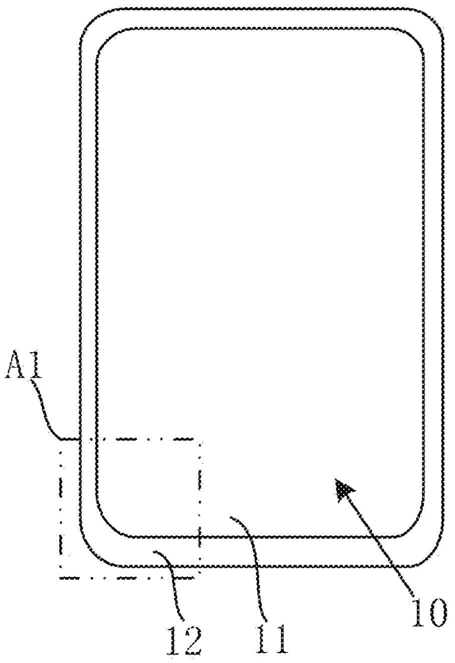
FIG. 1 is a schematic plan view of a display panel according to Embodiment 1 of the present application.

LIST OF THE REFERENCE CHARACTERS display panel 10; display region 11; non-display region 12; pixel region 13; data line Ma; signal trace Mb; first connection line Mc; first entity portion Mc1; first end Mc10 of the first solid portion; first portion Mc11; first sub-section Mc11; second portion Mc12; second sub-section Mc121;

first dummy portion Mc2; first end Mc20 of the first dummy portion; third portion Mc21; third sub-section Mc211; fourth portion Mc22; fourth sub-section Mc221; first gap Mc3; second connection line Md; second entity Md1; first end Md10 of the second solid portion; second dummy portion Md2; first end Md20 of the second dummy portion; second gap Md3; reset signal connection line Mvic; gate reset signal connection line Mvic1; anode reset signal connection line Mvic2; reset signal line Mvi; gate reset signal line Mvi1; anode reset signal line Mvi2; power signal line Me; fifth portion Me1; fifth sub-section Me11; sixth portion Me2; substrate 20; first substrate layer 21; first separation layer 22; second substrate layer 23; first metal layer 30; second metal layer 40; third metal layer 50; anode layer 60; fourth metal layer 70; first barrier layer 81; second separation layer 82; buffer layer 83; active layer 84; first gate insulating layer 85; second gate insulating layer 86; interlayer dielectric layer 87; first planarization layer 88; second planarization layer 89; pixel definition layer 90; liner layer 91; first gate GE1; second gate GE2; source S1; and drain D1.

DETAILED DESCRIPTION

According to a first aspect, a display panel is provided by the application and includes a display region provided with a plurality of data lines and a plurality of first connection lines, and a non-display region provided with a plurality of signal traces; the data lines and the first connection lines are intersected; in which the first connection lines include respective first entity portions and respective first dummy portions, each of the first entity portion and a corresponding one of the first dummy portions are spaced apart; each of the first entity portions is electrically connected to a corresponding one of the data lines and a respective one of the signal traces, each of the first dummy portions is electrically insulated from a corresponding one of the first entity portions, and each of first gaps is provided between a first end of a corresponding one of the first entity portions and a first end of a respective one of the first dummy portions; in which the display panel includes a substrate, and a first metal layer and a second metal layer sequentially stacked on the substrate, the display panel further includes a plurality of thin film transistors, and at least one of a source and a drain of each of the thin film transistors is located on the second metal layer; in which the first entity portion includes a first portion located on the first metal layer, the first dummy portion includes a third portion located on the first metal layer, and the first portion includes the first end of the first entity portion, and the third portion includes the first end of the first dummy portion.

Optionally, the first entity portion further includes a second portion located in the second metal layer, the second portion is electrically connected to the first portion through a via connection, and a resistivity of the first metal layer is greater than a resistivity of the second metal layer.

Optionally, one of gates of each of the thin film transistors is located in the first metal layer.

Optionally, the display region is further provided with a plurality of reset signal connection lines, the reset signal connection lines are intersected with the first connection lines; in which the reset signal connection lines are located in the second metal layer, the first portion includes at least one first sub-portion, the second portion includes at least one second sub-portion, and the at least one first sub-portion and the at least one second sub-portion are alternately arranged in an extension direction of the first entity portion; in which the reset signal connection lines span the plurality of the first connection lines, and at least one portion of the first entity portion which is overlapped with a corresponding one of the reset signal connection lines is the at least one first sub-portion, in a direction perpendicular to the substrate.

Optionally, the first dummy portion includes a fourth portion located in the second metal layer, the fourth portion is electrically connected to the third portion through the via connection, the third portion includes at least one third sub-portion, the fourth portion includes at least one fourth sub-portion, and the at least one third sub-portion and the at least one fourth sub-portion are alternately arranged in sequence in an extension direction of the first dummy portion; in which at least one portion of the first dummy portion which is overlapped with a corresponding one of the reset signal connection lines is the at least one third sub-portion in the direction perpendicular to the substrate.

Optionally, the display region is further provided with a plurality of second connection lines, the second connection lines and the first connection lines are intersected, the second connection lines comprise respective second entity portions and respective second dummy portions, each of the second entity portions and a corresponding one of the second dummy portions are spaced apart; the first entity portion is electrically connected to a corresponding one of the signal traces through a respective one of the second entity portions, each of the second dummy portions is electrically insulated from a corresponding one of the second entity portions, and each of second gaps is provided between a first end of a corresponding one of the second entity portions and a first end of a respective one of the second dummy portions; in which the display panel further includes a third metal layer disposed on a side of the second metal layer which is away from the substrate, the second connection lines and the data lines are located in the third metal layer, and each of the second gaps overlaps a corresponding one of the reset signal connection lines in the direction perpendicular to the substrate.

Optionally, the reset signal connection lines have same extension directions as the second connection lines, and overlap areas of the second connection lines and the reset signal connection lines in the direction perpendicular to the substrate accounts for 50% or more of a total area of the second connection lines.

Optionally, the display region is further provided with a plurality of reset signal lines, the reset signal lines have same extension directions as the first connection lines and are located in the first metal layer, and the reset signal lines and the first connection lines are not overlapped in the direction perpendicular to the substrate; in which the reset signal lines and the reset signal connection lines are intersected to form a grid-like structure in an array arrangement.

Optionally, the plurality of reset signal lines include gate reset signal lines and anode reset signal lines that are alternatively arranged, and the plurality of reset signal connection lines include gate reset signal connection lines and anode reset signal connection lines that are alternatively arranged; in which the gate reset signal lines are electrically connected to the gate reset signal connection lines, and the anode reset signal lines are electrically connected to the anode reset signal connection lines.

Optionally, the display region is further provided with a power signal line including a fifth portion and a sixth portion, the fifth portion and the sixth portion have same extension directions as the data lines, the fifth portion does not overlap a corresponding one of the data lines and a respective one of the second connection lines in the direction perpendicular to the substrate, the sixth portion does not overlap a corresponding one of the data lines and a respective one of the second connection lines; in which the fifth portion is located in the second metal layer, the fifth portion includes a plurality of fifth sub-portions arranged at intervals, and two adjacent of the fifth sub-portions are spaced apart by the at least one second sub-portion or the at least one fourth sub-portion; in which the sixth portion is located in the third metal layer, and the sixth portion is continuously disposed and is in parallel with the fifth portion.

Optionally, a line connecting three adjacent of the first gaps is a curve.

Optionally, a line connecting three adjacent of the second gaps is a curve.

Optionally, the display panel further includes an anode layer, the anode layer is disposed on a side of the second metal layer which is away from the substrate, in which an orthographic projection of the anode layer on the substrate covers orthographic projections of the first gaps on the substrate.

Optionally, the display panel further includes an anode layer, the anode layer is disposed on a side of the third metal layer which is away from the substrate, in which an orthographic projection of the anode layer on the substrate covers orthographic projections of the second gaps on the substrate.

According to a second aspect, the present application provides a display device including a housing and any one of the above mentioned display panels, in which the housing includes an accommodative space in which the display panel is provided.

The present application provides a display panel and a display device. The display panel includes a display region provided with a plurality of data lines and a plurality of first connection lines, and a non-display region provided with a plurality of signal traces. The data lines and the first connection lines are intersected. The first connection lines include respective first entity portions and respective first dummy portions. The first entity portion and the first dummy portion are spaced apart. The first entity portion is electrically connected to the data line and the signal trace. The first dummy portion is electrically insulated from the first entity portion. The first gap is provided between a first end of the first entity portion and a first end of the first dummy portion. The display panel includes a substrate, and a first metal layer and a second metal layer sequentially stacked on the substrate. The display panel further includes a plurality of thin film transistors. At least one of a source and a drain of the thin film transistor is located on the second metal layer. The first entity portion includes a first portion located in the first metal layer. The first dummy portion includes a third portion located in the first metal layer. The first portion includes a first end of the first entity portion. The third portion includes a first end of the first dummy portion. In the display panel provided by the present application, since in the first connection lines of the display region, the first gap is provided between the first end of each first entity portion and the first end of the corresponding first dummy portion, and the first ends of the first entity portions and the first ends of the first dummy portions are both located in the first metal layer at a lower position with respect to the second metal layer, the first gaps have less influence on the film layer flatness of the pixel region in the display region, thereby improving the screen-off mura problem and improving the appearance characteristics of the display panel in the screen-off state thereof.

In the following, the technical solutions in the embodiments of the present application will be clearly and completely described in connection with the accompanying drawings in the embodiments of the present application. It will be apparent that the described embodiments are merely some of the embodiments of the present application, rather than all the embodiments. Based on the embodiments in the present application, all other embodiments obtained by a person skilled in the art without involving any inventive effort are within the scope of the present application. Furthermore, it is to be understood that the specific embodiments described herein are for purposes of illustration and explanation only and are not intended to limit the application. In the present application, if not stated to the contrary, the positional terms used such as “upper” and “lower” usually refer to the upper and lower positions with respect to the device in actual use or working conditions, specifically to the direction in the drawings; while “inside” and “outside” refer to the outline of the device.

The following disclosure provides many different embodiments or examples for implementing the different structures of the present application. In order to simplify the disclosure of the present application, components and arrangements of specific examples are described below. Of course, they are merely examples and are not intended to limit the application. In addition, the present application may repeat reference numerals and/or reference letters in various instances, such repetition being for the purpose of simplicity and clarity, without itself indicating a relationship between the various embodiments and/or arrangements discussed. In addition, the present application provides examples of various specific processes and materials, but one of ordinary skill in the art will recognize the application of other processes and/or the use of other materials. In the following detailed description, it is to be noted that the order in which the following embodiments are described is not intended to limit the preferred order of the embodiments.

Embodiment 1

Figure 2:
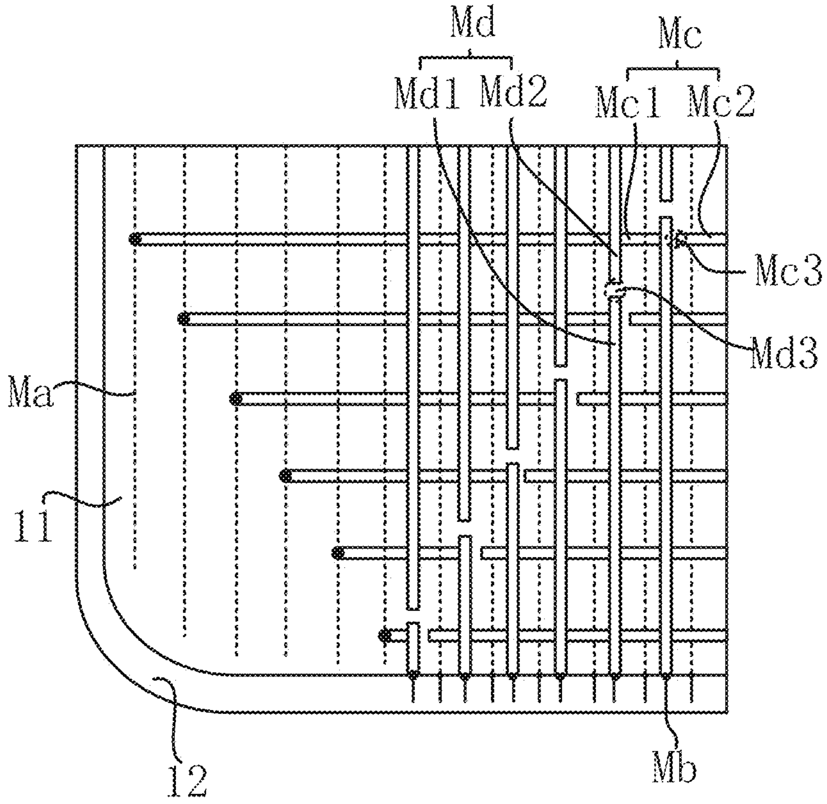
FIG. 2 is a partially enlarged view at a region A1 in FIG. 1.
Figure 3:
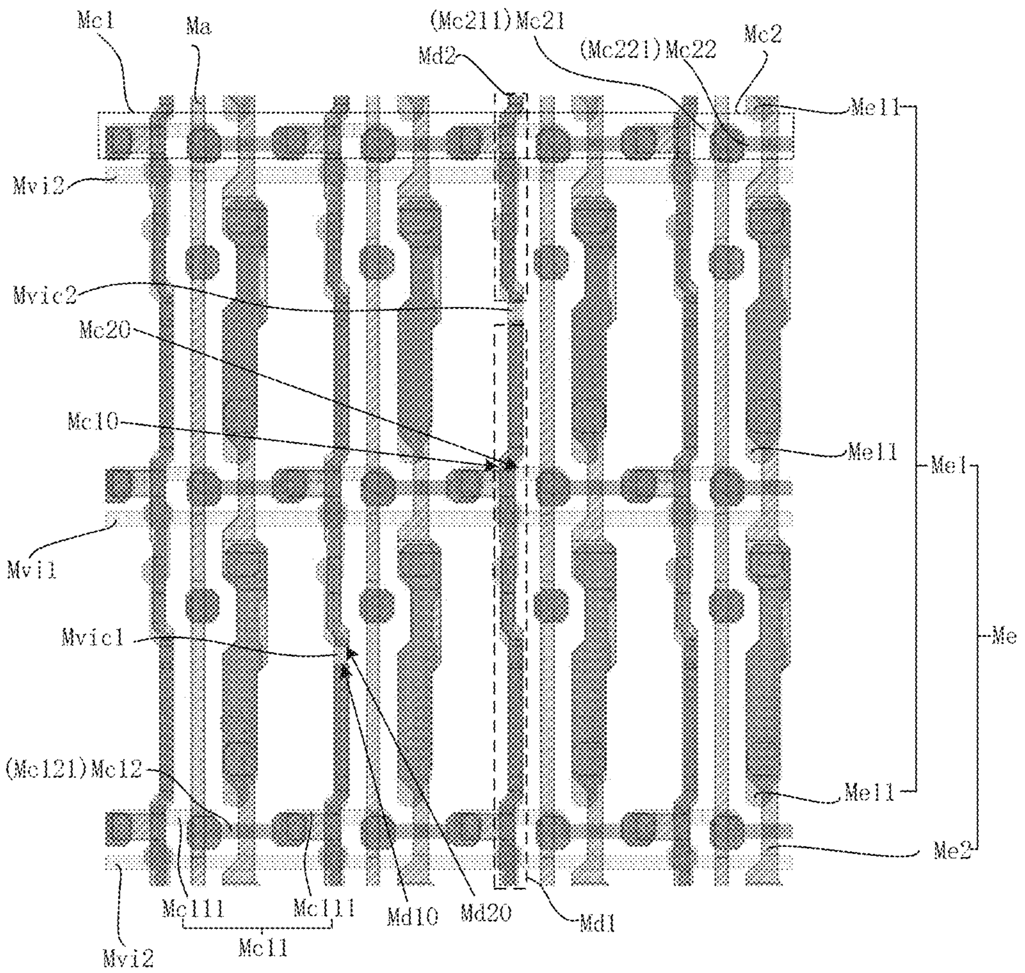
FIG. 3 is a partially enlarged view of FIG. 2.
Figure 4:
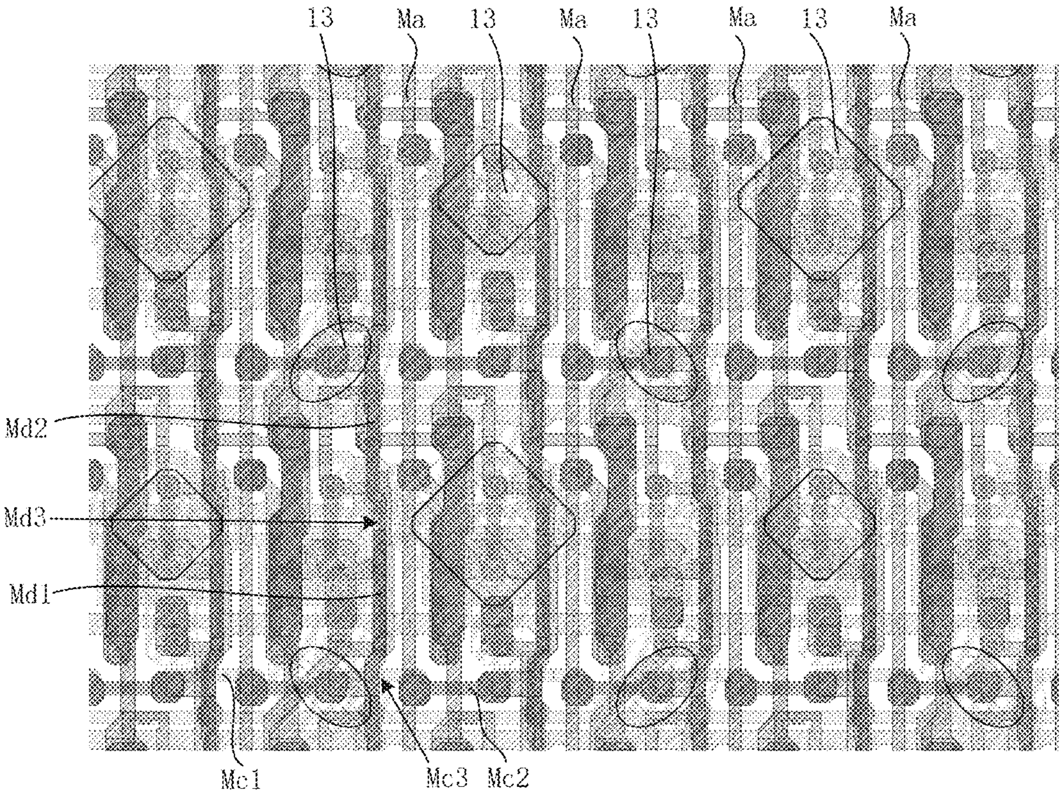
FIG. 4 is a schematic diagram of a position distribution of multiple pixel regions according to Embodiment 1 of the present application.
Figure 5:
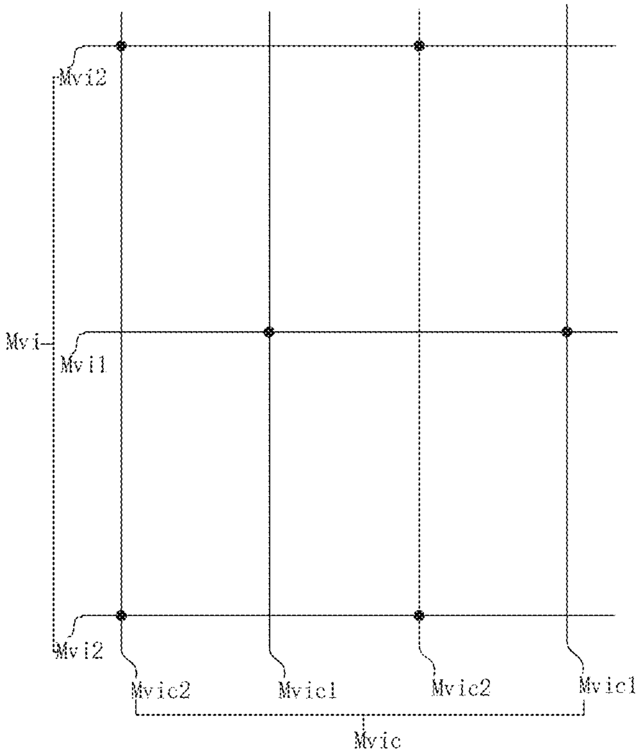
FIG. 5 is a plan view of reset signal lines and reset signal connection lines according to Embodiment 1 of the present application.
Figure 6:
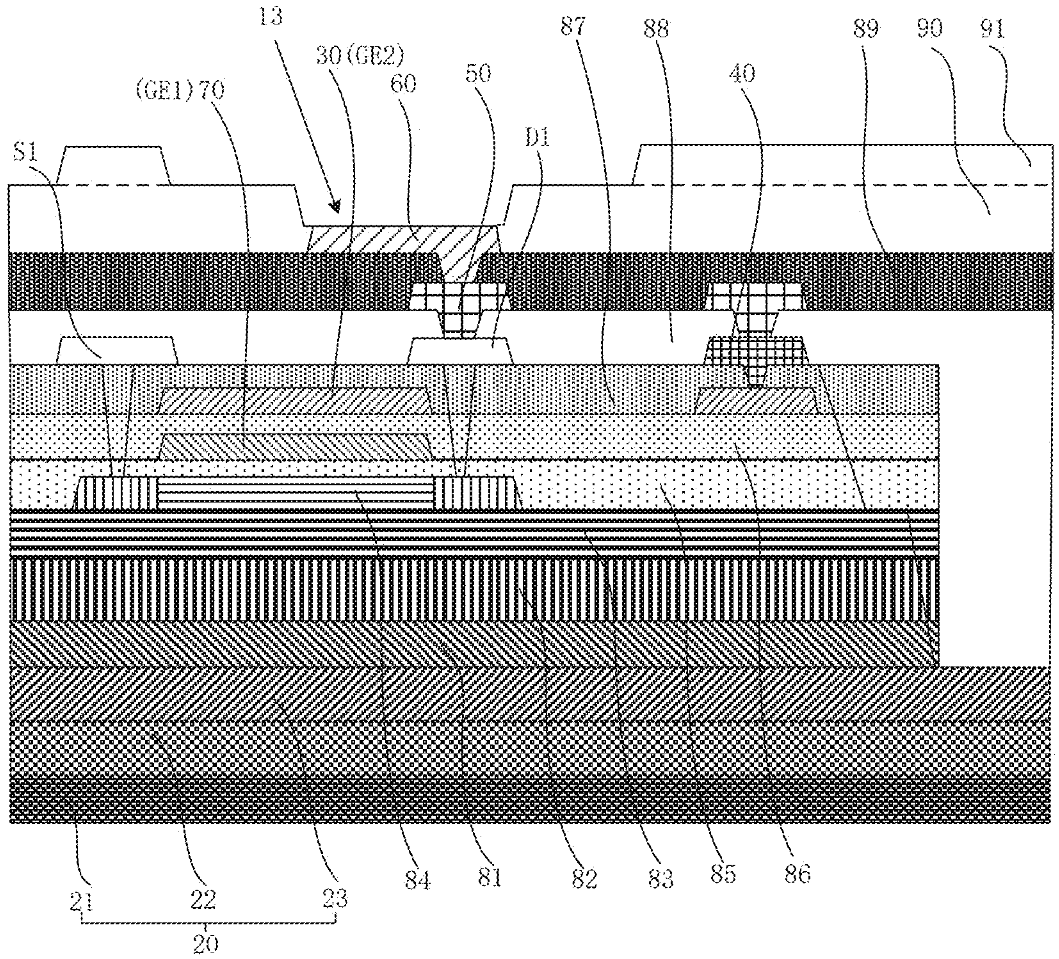
FIG. 6 is a schematic sectional view of a display panel according to Embodiment 1 of the present application.

FIG. 1 is a schematic plan view of a display panel according to Embodiment 1 of the present application; FIG. 2 is a partially enlarged view at a region A1 in FIG. 1; FIG. 3 is a partially enlarged view of FIG. 2; FIG. 4 is a schematic diagram of a position distribution of multiple pixel regions according to Embodiment 1 of the present application; FIG. 5 is a plan view of reset signal lines and reset signal connection lines according to Embodiment 1 of the present application; and FIG. 6 is a schematic sectional view of a display panel according to Embodiment 1 of the present application. As shown in FIGS. 1 to 6, in a first aspect, an embodiment of the present application provides a display panel, which may be an OLED display panel.

Specifically, the display panel 10 includes a display region 11 provided with multiple data lines Ma and multiple first connection lines Mc; and a non-display region 12. The data lines Ma and the first connection lines Mc are intersected with each other. The non-display region 12 is provided with multiple signal traces Mb. Each of the first connection lines Mc includes a first entity portion Mc1 and a first dummy portion Mc2 that are spaced apart. The first entity portion Mc1 is electrically connected to the data line Ma and the signal trace Mb, and the first dummy portion Mc2 is electrically insulated from the first entity portion Mc1. A first gap Mc3 is provided between a first end Mc10 of the first entity portion Mc1 and a first end Mc20 of the first dummy portion Mc2. The display panel 10 includes a substrate 20 and a first metal layer 30 and a second metal layer 40 sequentially stacked on the substrate 20. The display panel 10 further includes multiple thin film transistors, and at least one of a source S1 and a drain D1 of each thin film transistor is located on the second metal layer 40. The first entity portion Mc1 includes a first portion Mc11 located in the first metal layer 30, and the first dummy portion Mc2 includes a third portion Mc21 located in the first metal layer 30. The first portion Mc11 includes the first end Mc10 of the first entity portion Mc1, and the third portion Mc21 includes the first end Mc20 of the first dummy portion Mc2.

In the display panel 10 provided in the present application, the signal trace Mb is a fanout trace, and the fanout trace may not have a fan-out pattern. The first connection line Mc is intersect with the data line Ma, the first entity portion Mc1 in the first connection line Mc is electrically connected to the data line Ma and the signal trace Mb. The first dummy portion Mc2 in the first connection line Mc is electrically insulated from the first entity portion Mc1. That is, the first dummy portion Mc2 is a FIAA transverse connection line provided in the display region 11, and the first dummy portion Mc2 is a dummy trace corresponding to the FIAA transverse connection line in the display region 11.

Since the display region 11 includes multiple pixel regions 13 (or referred to as effective light-emitting regions) arranged in an array, and the first connection lines Mc are located in the display regions 11, the first gap Mc3 between the first end Mc10 of each first entity portion Mc1 and the first end Mc20 of a corresponding first dummy portion Mc2 easily affects the flatness of the film layer of the respective pixel region 13, for example, the flatness of the anode of the pixel region 13. When the first gaps Mc3 are linearly arranged, the flatness of the anodes of the respective pixel regions 13 decreases, so that depressions that are linearly arranged are formed in regions of the anodes which are corresponding to the first gaps Mc3, thereby causing the display panel 10 to generate the linear mura in the screen-off state thereof, and affecting the appearance characteristics of the display panel 10 in the screen-off state thereof.

In the display panel 10 provided in the present application, in the first connection lines Mc of the display area 11, a first gap Mc3 is provided between the first end Mc10 of the first entity portion Mc1 and the first end Mc20 of the first dummy portion Mc2, and the first end Mc10 of the first entity portion Mc1 and the first end Mc20 of the first dummy portion Mc2 are both located in the first metal layer 30 at a lower position with respect to the second metal layer 40. So, the influence of the first gap Mc3 on the film layer flatness of the pixel region 13 in the display region 11 is reduced, thereby improving the screen-off mura problem and improving the appearance characteristics of the display panel 10 in the screen-off state thereof.

In some embodiments of the present application, the display panel 10 further includes an anode layer 60 disposed on a side of the second metal layer 40 which is away from the substrate 20. The anode layer 60 includes multiple anodes, and the anodes are correspondingly disposed within the pixel regions 13. An orthographic projection of the anode layer 60 on the substrate 20 covers orthographic projections of the first gaps Mc3 on the substrate 20.

In the display panel 10 provided in the present application, since the orthographic projection of the anode layer 60 on the substrate 20 covers the orthographic projections of the first gaps Mc3 on the substrate 20, and the first end Mc10 of the first entity portion Mc1 and the first end Mc20 of the first dummy portion Mc2 on two sides of the first gap Mc3 are located in the first metal layer 30 at a lower position with respect to the second metal layer 40, the influence of the first gaps Mc3 on the flatness of respective anodes can be reduced, thereby improving the problem that depressions that are linearly arranged are formed in regions of the anodes which are corresponding to the first gaps Mc3, and improving the appearance characteristics of the display panel 10 in the screen-off state thereof.

In some embodiments of the present application, the first entity portion Mc1 further includes a second portion Mc12 located in the second metal layer 40. The second portion Mc12 is electrically connected to the first portion Mc11 through a via connection, and a resistivity of the first metal layer 30 is greater than a resistivity of the second metal layer 40.

In the display panel 10 provided in the present application, since the resistivity of the first metal layer 30 is greater than the resistivity of the second metal layer 40, when the first entity portions Mc1 are all located in the first metal layer 30, the resistances of the first entity portions Mc1 will be greatly increased, which will affect the transmission of the data signal and further affect the display effect of the display panel 10. In order to overcome the above-mentioned problem of increasing the resistances of the first entity portions Mc1, the first portions Mc11 of the first entity portions Mc1 are located on the first metal layer 30, and the second portions Mc12 of the first entity portion Mc1 are located on the second metal layer 40 having a lower resistivity than the first metal layer 30, so that the resistances of the first entity portions Mc1 can be reduced, the transmission quality of the data signal of the first entity portions Mc1 can be improved, and the display quality of the display panel 10 can be improved.

In some embodiments of the present application, one of gates of each of the thin film transistors is located in the first metal layer 30. That is, the first portion Mc11 of the first entity portion Mc1 is provided in the same layer as one of the gates of the thin film transistor, and the material of the one gate is different from the material of at least one of the source S1 and the drain D1.

In some embodiments of the present application, the display region 11 is further provided with multiple reset signal connection lines Mvic. The reset signal connection lines Mvic are intersected with the first connection lines Mc. The reset signal connection lines Mvic are located in the second metal layer 40. The first portion Mc11 includes at least one first sub-portion Mc111, and the second portion Mc12 includes at least one second sub-portion Mc121. The at least one first sub-portion Mc111 and the at least one second sub-portion Mc121 are alternately arranged in sequence in an extension direction of the first entity portion Mc1. The reset signal connection lines Mvic span the first connection lines Mc. At least one portion of the first entity portion Mc1 which is overlapped with the reset signal connection line Mvic is the at least one first sub-portion Mc111, in a direction perpendicular to the substrate 20.

In the display panel 10 provided in the present application, since the reset signal connection lines Mvic and the first connection lines Mc are intersected with each other, portions, which are located in the same film layer, of both the reset signal connection line Mvic and the first connection line Mc are interacted with each other. That is, the reset signal connection line Mvic and the first entity portion Mc1 in the first connection line Mc cannot be disposed in a same layer at their intersect portion.

First, in the present application, by providing the reset signal connection lines Mvic in the second metal layer 40 having a lower resistivity, it is possible to improve the conduction efficiency of a plurality of reset signal lines Mvi connected in parallel through the reset signal connection lines Mvic. Secondly, since the first portion Mc11 includes at least one first sub-portion Mc111, and the second portion Mc12 includes at least one second sub-portion Mc121, the at least one first sub-portion Mc111 and the at least one second portion Mc121 are alternately arranged in sequence in the extension direction of the first entity portion Mc1. Further, in the direction perpendicular to the substrate 20, the portion of the first entity portion Mc1 which overlaps the reset signal connection line Mvic is the first sub-portion Mc111 that is at a different layer from the reset signal connection line Mvic. Accordingly, it is possible to increase the portion of the first connection line Mc which is in the second metal layer 40 having a lower resistivity as much as possible, and the first entity portions Mc1 in the first connection lines Mc and the reset signal connection lines Mvic spanning the plurality of the first connection lines Mc are not interfered at their respective intersection positions by the bridging design of the first sub-portions Mc111, thereby making the line layout of the display panel 10 preferable.

In some embodiments of the present application, the first dummy portion Mc2 includes a fourth portion Mc22 located in the second metal layer 40. The fourth portion Mc22 is electrically connected to the third portion Mc21 through the via connection. The third portion Mc21 includes at least one third sub-portion Mc211. The fourth portion Mc22 includes at least one fourth sub-portion Mc221. The at least one third sub-portion Mc211 and the at least one fourth sub-portion Mc221 are alternately arranged in sequence in an extension direction of the first dummy portion Mc2. At least one portion of the first dummy portion Mc2 which is overlapped with the reset signal connection line Mvic is the at least one third sub-portion Mc211 in the direction perpendicular to the substrate 20.

Similarly, in the display panel 10 provided in the present application, since the reset signal connection lines Mvic and the first connection lines Mc are intersected with each other, portions, which are located in the same film layer, of both the reset signal connection line Mvic and the first connection line Mc are interacted with each other. That is, the reset signal connection line Mvic and the first dummy portion Mc2 in the first connection line Mc cannot be disposed in a same layer at their intersect portion.

First, in the present application, the first dummy portion Mc2 is arranged in such a manner that the third sub-portion (s) Mc211 and the fourth sub-portion(s) Mc221 are arranged alternately in sequence, so that the line structures of the first dummy portions Mc2 are similar to the line structures of the first entity portions Me1. In this way, the first connection lines Mc in the display region 11 have a more uniform patterning design, and the appearance characteristics of the display panel 10 is improved. Next, in the present application, in the direction perpendicular to the substrate 20, an overlapped portion of both the first dummy portion Mc2 and the reset signal connection line Mvic is the third sub-portion Mc211 that is at a different layer from the reset signal connection line Mvic. So, the first dummy portion Mc2 in the first connection line Mc and the reset signal connection line Mvic that spans the plurality of the first connection lines Mc do not interfere at their intersection position, thereby making the line layout of the display panel 10 preferable.

In some embodiments of the present application, the third sub-portion Mc211 and the first sub-portion Mc111 have the same shape, and the fourth sub-portion Mc221 and the second sub-portion Mc121 have the same shape. So, the first connection lines Mc in the display region 11 have a more uniform patterned design.

In some embodiments of the present application, the display region 11 is further provided with a plurality of second connection lines Md. The second connection lines Md and the first connection lines Mc are intersected. The second connection line Md include a second entity portion Md1 and a second dummy portion Md2 that are spaced apart. The first entity portion Mc1 is electrically connected to the signal trace Mb through the second entity portion Md1, and the second dummy portion Md2 is electrically insulated from the second entity portion Md1. A second gap Md3 is provided between a first end Md10 of the second entity portion Md1 and a first end Md20 of the second dummy portion Md2. The display panel 10 further includes a third metal layer 50 disposed on a side of the second metal layer 40 which is away from the substrate 20. The second connection lines Md and the data lines Ma are located in the third metal layer 50. The second gap Md3 overlaps the reset signal connection line Mvic in the direction perpendicular to the substrate 20.

Since the display region 11 includes multiple pixel regions 13 (or referred to as effective light-emitting regions) arranged in an array, and the second connection lines Md are located in the display region 11, the second gap Md3 between the first end Md10 of each second entity portion Md1 and the first end Md20 of a corresponding first dummy portion Md2 easily affects the flatness of the film layer of the respective pixel region 13, for example, the flatness of the anode of the pixel region 13. When the second gaps Md3 are linearly arranged, the flatness of the anodes of the respective pixel regions 13 decreases, so that depressions that are linearly arranged are formed in regions of the anodes which are corresponding to the first gaps Mc3, thereby causing the display panel 10 to generate the linear mura in the screen-off state thereof, and affecting the appearance characteristics of the display panel 10 in the screen-off state thereof. And since the second connection lines Md located in the display region 11 need to satisfy the design requirements of different layers from the first connection lines Mc, the second connection lines Md need to be provided in the third metal layer 50 at a relatively high position together with the data lines Ma. In this way, the second gaps Md3 have a greater influence on the appearance characteristics of the display panel 10 in the screen-off state thereof.

In the present application, the second gaps Md3 are overlapped with the respective reset signal connection lines Mvic in the direction perpendicular to the substrate 20 by using the reset signal connection lines Mvic existing in the display structure, thereby supporting the second gaps Md3 by the respective reset signal connection lines Mvic. In this way, the probability that the anode layer 60 has a planarization problem at the second gaps Md3 is reduced, the light diffraction effect at each of the second gaps Md3 arranged linearly is weakened, thereby improving the screen-off mura problem at the second gaps Md3.

In some embodiments of the present application, the second metal layer 40 and the third metal layer 50 are made of the same material, so that the visible effects of the reset signal connection lines Mvic and the second connection lines Md can be made the same, and the light diffraction effect at each of the second gaps Md3 in the linear arrangement can be further weakened.

In some embodiments of the present application, the anode layer 60 is disposed on a side of the third metal layer 50 which is away from the substrate 20. An orthographic projection of the anode layer 60 on the substrate 20 covers orthographic projections of the second gaps Md3 on the substrate 20.

In the display panel 10 provided in the present application, since the orthographic projection of the anode layer 60 on the substrate 20 covers the orthographic projections of the second gaps Md3 on the substrate 20, and the second gaps Md3 are overlapped with the reset signal connection lines Mvic in the direction perpendicular to the substrate 20, the influence of the second gaps Md3 on the flatness of respective anodes can be reduced, thereby improving the problem that depressions that are linearly arranged are formed in regions of the anodes which are corresponding to the second gaps Md3 when the second gaps Md3 are linearly arranged, and improving the appearance characteristics of the display panel 10 in the screen-off state thereof.

In some embodiments of the present application, each of the reset signal connection lines Mvic is disposed continuously within the display region 11.

In some embodiments of the present application, the reset signal connection lines Mvic have same extension directions as the second connection lines Md, and overlap areas of the second connection lines Md and the reset signal connection lines Mvic in the direction perpendicular to the substrate 20 accounts for 50% or more of a total area of the second connection lines Md.

In the display panel 10 provided in the present application, since the reset signal connection lines Mvic are a layout design existing in the display structure, the present application enables the second connection lines Md to coincide with the reset signal connection lines Mvic as much as possible in the direction perpendicular to the substrate 20 by making the overlapped area between the second connection lines Md and the reset signal connection lines Mvic account for 50% or more of the total area of the second connection lines Md. So, when the display panel 10 has a Fingerprint on Display (referred briefly to as FOD) sensing module, the light transmittance of the FOD sensing module can be improved, and the fingerprint sensing accuracy can be improved.

In some embodiments of the present application, the display region 11 is further provided with a plurality of reset signal lines Mvi, which extend in the same direction as the first connection lines Mc. The reset signal lines Mvi are located in the first metal layer 30. The reset signal lines Mvi do not overlap the first connection lines Mc in the direction perpendicular to the substrate 20. The reset signal lines Mvi and the reset signal connection lines Mvic are intersected, which forms a grid-like structure in the array arrangement.

In the display panel 10 provided in the present application, since the reset signal lines Mvi extend in the same direction as the first connection lines Mc, and are located in the first metal layer 30, the reset signal lines Mvi does not interfere with the reset signal connection lines Mvic located in the second metal layer 40, as well as the data lines Ma and the second connection lines Md located in the third metal layer 50. Since the reset signal lines Mvi and the first connection lines Mc do not overlap in the direction perpendicular to the substrate 20, the reset signal lines Mvi does not interfere with the first connection lines Mc, thereby making it possible to effectively reduce the difficulty in layout design. In addition, since the reset signal lines Mvi and the reset signal connection lines Mvic are intersected, and a grid-like structure in an array arrangement is formed, the patterned structure of each region can be made regular, and display uniformity of the display panel 10 can be improved.

In some embodiments of the present application, the plurality of reset signal lines Mvi include gate reset signal lines Mvi1 and anode reset signal lines Mvi2 that are alternatively arranged. The plurality of reset signal connection lines Mvic include gate reset signal connection lines Mvic1 and anode reset signal connection lines Mvic2 that are alternatively arranged. The gate reset signal lines Mvi1 and the gate reset signal connection lines Mvic1 are electrically connected. The anode reset signal lines Mvi2 and the anode reset signal connection lines Mvic2 are electrically connected.

In the display panel 10 provided by the present application, a plurality of the reset signal lines Mvi include gate reset signal lines Mvi1 and anode reset signal lines Mvi2 that are alternatively arranged, and a plurality of the reset signal connection lines Mvic include gate reset signal connection lines Mvic1 and anode reset signal connection lines Mvic2 that are alternatively arranged. Therefore, it is possible to enable the display panel 10 to realize gate reset and anode reset, thereby increasing the reset signal types of the display panel 10, and improving the display quality of the display panel 10.

In some embodiments of the present application, the display region 11 is further provided with a power supply signal line Me. The power supply signal line Me include a fifth portion Me1 and a sixth portion Me2. The extension direction of the fifth portion Me1 and the extension direction of the sixth portion Me2 are the same as the extension direction of the data line Ma. In the direction perpendicular to the substrate 20, the fifth portion Me1 is not overlapped with the data line Ma and the second connection Md; and the sixth portion Me2 is not overlapped with the data line Ma and the second connection line Md. The fifth portion Me1 is located in the second metal layer 40. The fifth portion Me1 includes a plurality of fifth sub-portions Me11 provided at intervals. Two adjacent fifth sub-portions Me11 are separated by the second sub-portion(s) Mc121 or the fourth sub-portion(s) Mc221. The sixth portion Me2 is located in the third metal layer 50. The sixth portion Me2 is continuously provided and is in parallel with the fifth portion Me1.

In the display panel 10 provided in the present application, the power supply signal line Me may be a VDD signal line. The extension direction of the fifth portion Me1, the extension direction of the sixth portion Me2, and the extension direction of the data line Ma are the same. And, in the direction perpendicular to the substrate 20, the fifth portion Me1 does not overlap the data line Ma and the second connection line Md, and the sixth portion Me2 does not overlap the data line Ma and the second connection line Md. So, the power supply signal line Me does not interfere with the data line Ma and the second connection line Md, and thus the layout design difficulty can be effectively reduced.

Further, the fifth portions Me1 are located in the second metal layer 40. The fifth portion Me1 includes a plurality of fifth sub-portions Me11 provided at intervals, and two adjacent fifth sub-portions Me11 are separated by the second sub-portion(s) Mc121 or the fourth sub-portion(s) Mc221. That is, the two adjacent fifth sub-portions Me11 are disconnected at the second sub-portion(s) Mc121 or the fourth sub-portion(s) Mc221 that are provided at the same layer as these two adjacent fifth sub-portions. In this way, it is possible to avoid interference between the fifth portion Me1 in the power supply signal line Me and the second portion Mc12 or the fourth sub-portion(s) Mc221 in the first connection line Mc, and thus it is possible to effectively reduce the layout design difficulty.

Further, since the sixth portion Me2 is located in the third metal layer 50, and the sixth portion Me2 is continuously provided and is in parallel with the fifth portion Me1, it is possible to reduce the resistance of the power supply signal line Me, reduce the resistance-capacitance delay, and improve the display uniformity of the display panel 10 by connecting the fifth portion Me1 and the sixth portion Me2 in parallel.

In some embodiments of the present application, the display panel 10 includes a thin film transistor including a first gate GE1, a second gate GE2, a source S1, and a drain D1. The second gate GE2 is located in the first metal layer 30. The source S1, and the drain D1 are located in the second metal layer 40. The display panel 10 further includes a fourth metal layer 70 disposed on a side of the first metal layer 30 which is adjacent to the substrate 20. The first gate electrode GE1 is disposed on the fourth metal layer 70. Of course, the positions of the first gate, the second gate, and the fourth metal layer are not limited in the present application. In other embodiments of the present application, the fourth metal layer may be disposed between the first metal layer 30 and the second metal layer 40. The first gate may be located in the first metal layer 30, and the second gate may be located in the fourth metal layer.

In some embodiments of the present application, at least one of the material and the film structure of the first metal layer 30 is different from the material and the film structure of the second metal layer 40. The material and the film structure of the second metal layer 40 are the same as the material and the film structure of the third metal layer 50.

In some embodiments of the present application, one of the reset signal lines Mvi is provided between two adjacent first connection lines Mc, and one of the reset signal lines Mvic is provided between two adjacent second connection lines Md. Further, the line of connecting the three adjacent first gaps Mc3 is a straight line, and the line of connecting the three adjacent second gaps Md3 is a straight line.

In some embodiments of the present application, the substrate 20 includes a first substrate layer 21, a first separation layer 22, and a second substrate layer 23. Of course, in other embodiments of the present application, the substrate 20 may include only the first substrate layer 21.

In some embodiments of the present application, the display panel 10 further includes a first barrier layer 81, a second separation layer 82, a buffer layer 83, an active layer 84, a first gate insulating layer 85, a second gate insulating layer 86, an interlayer dielectric layer 87, a first planarization layer 88, a second planarization layer 89, a pixel definition layer 90, and a liner layer 91 disposed in sequence on the substrate 20. The fourth metal layer 70 is disposed on a side of the first gate insulating layer 85 which is away from the substrate 20. The second gate insulating layer 86 is disposed between the fourth metal layer 70 and the first metal layer 30. The interlayer dielectric layer 87 is disposed between the first metal layer 30 and the second metal layer 40. The first planarization layer 88 is disposed between the second metal layer 40 and the third metal layer 50. The second planarization layer 89 is disposed on a side of the third metal layer 50 which is away from the substrate 20. The anode layer 60 is disposed on the side of the second planarization layer 89 which is away from the substrate 20. The pixel definition layer 90 is disposed on the side of the anode layer 60 which is away from the substrate 20. The pixel definition layer 90 and the liner layer 91 are integrally formed.

According to a second aspect, an embodiment of the present application provides a display device including a housing, and a display panel 10 according to any one of the above, in which the housing has an accommodate space in which the display panel 10 is disposed.

Embodiment 2

Figure 7:
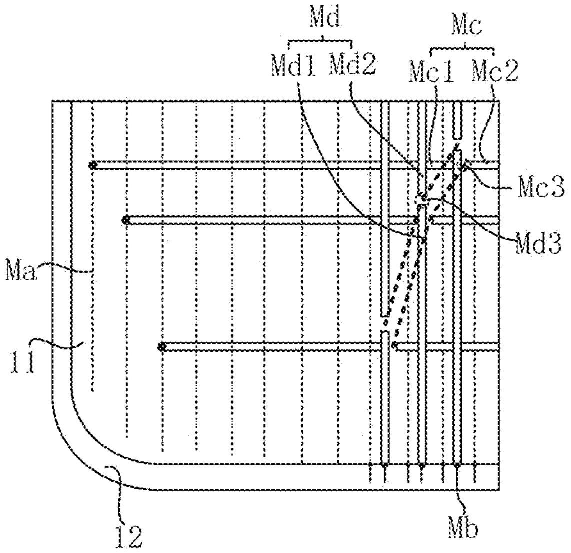
FIG. 7 is another partially enlarged view at the region A1 in FIG. 1.

FIG. 7 is another partially enlarged view at the region A1 in FIG. 1. As shown in FIG. 1, FIG. 6, and FIG. 7, Embodiment 2 of the present application provides a display panel 10 and a display device. The display panel 10 includes a display region 11 provided with a plurality of data lines Ma and a plurality of first connection lines Mc; and a non-display region 12 provided with a plurality of signal traces Mb. The data lines Ma and the first connection lines Mc are intersected. Each of the first connection lines Mc include a first entity portion Mc1 and a first dummy portion Mc2 spaced apart. The first entity portion Mc1 is electrically connected to the data line Ma and the signal trace Mb, and the first dummy portion Mc2 is electrically insulated from the first entity portion Mc1. A first gap Mc3 is provided between a first end Mc10 of the first entity portion Mc1 and a first end Mc20 of the first dummy portion Mc2. The display panel 10 includes a substrate 20 and a first metal layer 30 and a second metal layer 40 sequentially stacked on the substrate 20. The display panel 10 further includes multiple thin film transistors, and at least one of a source S1 and a drain D1 of the thin film transistor is located on the second metal layer 40. The first entity portion Mc1 includes a first portion Mc11 located in the first metal layer 30, and the first dummy portion Mc2 includes a third portion Mc21 located in the first metal layer 30. The first portion Mc11 includes the first end Mc10 of the first entity portion Mc1. The third portion Mc21 includes the first end Mc20 of the first dummy portion Mc2. The display device includes the housing and the display panel 10. The housing includes an accommodative space, and the display panel 10 is provided in the accommodative space.

It should be noted that the structures of the display panel 10 and the display device provided in Embodiment 2 of the present application is similar to that of the display panel 10 and the display device provided in Embodiment 1 of the present application. Details of the same parts are not described in Embodiment 2 of the present application.

In some embodiments of the present application, the line of connecting the three adjacent first gaps Mc3 is a curve.

In the display panel 10 provided in the present application, since the line of connecting the three adjacent first gaps Mc3 is the curve, the linear mura problem caused by the linear arrangement of the plurality of first gaps Mc3 can be further improved, and the appearance characteristics of the display panel 10 in the screen-off state thereof can be further improved.

In some embodiments of the present application, the line of connecting the three adjacent second gaps Md3 is a curve.

In the display panel 10 provided in the present application, since the line of connecting the adjacent three second gaps is the curve, the linear mura problem caused by the linear arrangement of the plurality of gaps can be further improved, and the appearance characteristics of the display panel 10 in the screen-off state thereof can be further improved.

Specifically, with reference to FIG. 7, by making the distance between two adjacent first connecting lines Mc among the three adjacent first connecting lines Mc different from the distance between other two adjacent first connecting lines Mc, the line of connecting the three adjacent first gaps Mc3 may be the curve, and the line of connecting the three adjacent second gaps Md3 may be the curve. Of course, in other embodiments of the present application, it is also possible to make the line of connecting the three adjacent first gaps Mc3 and the line of connecting the three adjacent second gaps Md3 to be the curve, by making the distance between the two adjacent second connection lines Md among the three adjacent second connection lines Md different from the distance between the other two adjacent second connection lines Md.

In summary, the present application provides a display panel and a display device. The display panel includes a display region provided with a plurality of data lines and a plurality of first connection lines, and a non-display region provided with a plurality of signal traces. The data lines and the first connection lines are intersected. The first connection lines include respective first entity portions and respective first dummy portions. The first entity portion and the first dummy portion are spaced apart. The first entity portion is electrically connected to the data line and the signal trace. The first dummy portion is electrically insulated from the first entity portion. The first gap is provided between a first end of the first entity portion and a first end of the first dummy portion. The display panel includes a substrate, and a first metal layer and a second metal layer sequentially stacked on the substrate. The display panel further includes a plurality of thin film transistors. At least one of a source and a drain of the thin film transistor is located on the second metal layer. The first entity portion includes a first portion located in the first metal layer. The first dummy portion includes a third portion located in the first metal layer. The first portion includes a first end of the first entity portion. The third portion includes a first end of the first dummy portion. In the display panel provided by the present application, since in the first connection lines of the display region, the first gap is provided between the first end of each first entity portion and the first end of the corresponding first dummy portion, and the first ends of the first entity portions and the first ends of the first dummy portions are both located in the first metal layer at a lower position with respect to the second metal layer, the first gaps have less influence on the film layer flatness of the pixel region in the display region, thereby improving the screen-off mura problem and improving the appearance characteristics of the display panel in the screen-off state thereof.

The display panel and the display device according to an embodiment of the present application has been described in detail, and the principles and the embodiments of the present application are described herein by using specific regulations. The description of the above embodiments is merely provided to help understand the method and the core idea of the present application. At the same time, variations will occur to those skilled in the art in both the detailed description and the scope of application in accordance with the teachings of the present application. In view of the foregoing, the present description should not be construed as limiting the application.

What is claimed is:

1. A display panel comprising a display region provided with a plurality of data lines and a plurality of first connection lines, and a non-display region provided with a plurality of signal traces; the data lines and the first connection lines being intersected;

wherein the plurality of first connection lines comprise respective first entity portions and respective first dummy portions, each of the first entity portion and a corresponding one of the first dummy portions are spaced apart; each of the first entity portions is electrically connected to a corresponding one of the data lines and a respective one of the signal traces, each of the first dummy portions is electrically insulated from a corresponding one of the first entity portions, and each of first gaps is provided between a first end of a corresponding one of the first entity portions and a first end of a respective one of the first dummy portions;

wherein the display panel comprises a substrate, and a first metal layer and a second metal layer sequentially stacked on the substrate, the display panel further comprises a plurality of thin film transistors, and at least one of a source and a drain of each of the thin film transistors is located on the second metal layer;

wherein the first entity portion comprises a first portion located on the first metal layer, the first dummy portion comprises a third portion located on the first metal layer, and the first portion comprises the first end of the first entity portion, and the third portion comprises the first end of the first dummy portion;

wherein the first entity portion further comprises a second portion located in the second metal layer, the second portion is electrically connected to the first portion through a via connection, and a resistivity of the first metal layer is greater than a resistivity of the second metal layer.

2. The display panel according to claim 1, wherein one of gates of each of the thin film transistors is located in the first metal layer.

3. The display panel according to claim 1, wherein the display region is further provided with a plurality of reset signal connection lines, the reset signal connection lines are intersected with the first connection lines;

wherein the reset signal connection lines are located in the second metal layer, the first portion comprises at least one first sub-portion, the second portion comprises at least one second sub-portion, and the at least one first sub-portion and the at least one second sub-portion are alternately arranged in an extension direction of the first entity portion;

wherein the reset signal connection lines span the plurality of the first connection lines, and at least one portion of the first entity portion which is overlapped with a corresponding one of the reset signal connection lines is the at least one first sub-portion, in a direction perpendicular to the substrate.

4. The display panel according to claim 3, wherein the first dummy portion comprises a fourth portion located in the second metal layer, the fourth portion is electrically connected to the third portion through the via connection, the third portion comprises at least one third sub-portion, the fourth portion comprises at least one fourth sub-portion, and the at least one third sub-portion and the at least one fourth sub-portion are alternately arranged in sequence in an extension direction of the first dummy portion;

wherein at least one portion of the first dummy portion which is overlapped with a corresponding one of the reset signal connection lines is the at least one third sub-portion in the direction perpendicular to the substrate.

5. The display panel according to claim 4, wherein the display region is further provided with a plurality of second connection lines, the second connection lines and the first connection lines are intersected, the second connection lines comprise respective second entity portions and respective second dummy portions, each of the second entity portions and a corresponding one of the second dummy portions are spaced apart; the first entity portion is electrically connected to a corresponding one of the signal traces through a respective one of the second entity portions, each of the second dummy portions is electrically insulated from a corresponding one of the second entity portions, and each of second gaps is provided between a first end of a corresponding one of the second entity portions and a first end of a respective one of the second dummy portions;

wherein the display panel further comprises a third metal layer disposed on a side of the second metal layer which is away from the substrate, the second connection lines and the data lines are located in the third metal layer, and each of the second gaps overlaps a corresponding one of the reset signal connection lines in the direction perpendicular to the substrate.

6. The display panel according to claim 5, wherein the reset signal connection lines have same extension directions as the second connection lines, and overlap areas of the second connection lines and the reset signal connection lines in the direction perpendicular to the substrate accounts for 50% or more of a total area of the second connection lines.

7. The display panel according to claim 6, wherein the display region is further provided with a plurality of reset signal lines, the reset signal lines have same extension directions as the first connection lines and are located in the first metal layer, and the reset signal lines and the first connection lines are not overlapped in the direction perpendicular to the substrate;

wherein the reset signal lines and the reset signal connection lines are intersected to form a grid-like structure in an array arrangement.

8. The display panel according to claim 7, wherein the plurality of reset signal lines comprise gate reset signal lines and anode reset signal lines that are alternatively arranged, and the plurality of reset signal connection lines comprise gate reset signal connection lines and anode reset signal connection lines that are alternatively arranged; wherein the gate reset signal lines are electrically connected to the gate reset signal connection lines, and the anode reset signal lines are electrically connected to the anode reset signal connection lines.

9. The display panel according to claim 5, wherein the display region is further provided with a power signal line comprising a fifth portion and a sixth portion, the fifth portion and the sixth portion have same extension directions as the data lines, the fifth portion does not overlap a corresponding one of the data lines and a respective one of the second connection lines in the direction perpendicular to the substrate, the sixth portion does not overlap a corresponding one of the data lines and a respective one of the second connection lines; wherein the fifth portion is located in the second metal layer, the fifth portion comprises a plurality of fifth sub-portions arranged at intervals, and two adjacent of the fifth sub-portions are spaced apart by the at least one second sub-portion or the at least one fourth sub-portion;

wherein the sixth portion is located in the third metal layer, and the sixth portion is continuously disposed and is in parallel with the fifth portion.

10. The display panel according to claim 1, wherein a line connecting three adjacent of the first gaps is a curve.

11. The display panel according to claim 5, wherein a line connecting three adjacent of the second gaps is a curve.

12. The display panel according to claim 1, wherein the display panel further comprises an anode layer, the anode layer is disposed on a side of the second metal layer which is away from the substrate, wherein an orthographic projection of the anode layer on the substrate covers orthographic projections of the first gaps on the substrate.

13. The display panel according to claim 5, wherein the display panel further comprises an anode layer, the anode layer is disposed on a side of the third metal layer which is away from the substrate, wherein an orthographic projection of the anode layer on the substrate covers orthographic projections of the second gaps on the substrate.

14. A display device comprising a housing and a display panel, wherein the housing comprises an accommodative space, the display panel is disposed in the accommodative space, the display panel comprises a display region and a non-display region, the display region is provided with a plurality of data lines and a plurality of first connection lines, the data lines and the first connection lines are intersected, and the non-display region is provided with a plurality of signal traces;

wherein the plurality of first connection lines comprise respective first entity portions and respective first dummy portions, each of the first entity portion and a corresponding one of the first dummy portion are spaced apart; each of the first entity portions is electrically connected to a corresponding one of the data lines and a respective one of the signal traces, each of the first dummy portions is electrically insulated from a corresponding one of the first entity portions, and each of first gaps is provided between a first end of a corresponding one of the first entity portions and a first end of a respective one of the first dummy portions;

wherein the display panel comprises a substrate, and a first metal layer and a second metal layer sequentially stacked on the substrate, the display panel further comprises a plurality of thin film transistors, and at least one of a source and a drain of each of the thin film transistors is located on the second metal layer;

wherein the first entity portion comprises a first portion located on the first metal layer, the first dummy portion comprises a third portion located on the first metal layer, and the first portion comprises the first end of the first entity portion, and the third portion comprises the first end of the first dummy portion;

wherein the first entity portion further comprises a second portion located in the second metal layer, the second portion is electrically connected to the first portion through a via connection, and a resistivity of the first metal layer is greater than a resistivity of the second metal layer.

15. The display device according to claim 14, wherein one of gates of each of the thin film transistors is located in the first metal layer.

16. The display device according to claim 14, wherein the display region is further provided with a plurality of reset signal connection lines, the reset signal connection lines are intersected with the first connection lines;

wherein the reset signal connection lines are located in the second metal layer, the first portion comprises at least one first sub-portion, the second portion comprises at least one second sub-portion, and the at least one first sub-portion and the at least one second sub-portion are alternately arranged in an extension direction of the first entity portion;

wherein the reset signal connection lines span the plurality of the first connection lines, and at least one portion of the first entity portion which is overlapped with a corresponding one of the reset signal connection lines is the at least one first sub-portion in the direction perpendicular to the substrate.

17. The display device according to claim 14, wherein a line connecting three adjacent of the first gaps is a curve.

18. The display device according to claim 14, wherein the display panel further comprises an anode layer, the anode layer is disposed on a side of the second metal layer which is away from the substrate, wherein an orthographic projection of the anode layer on the substrate covers orthographic projections of the first gaps on the substrate.

19. The display device according to claim 16, wherein the first dummy portion comprises a fourth portion located in the second metal layer, the fourth portion is electrically connected to the third portion through the via connection, the third portion comprises at least one third sub-portion, the fourth portion comprises at least one fourth sub-portion, and the at least one third sub-portion and the at least one fourth sub-portion are alternately arranged in sequence in an extension direction of the first dummy portion;

wherein at least one portion of the first dummy portion which is overlapped with a corresponding one of the reset signal connection lines is the at least one third sub-portion in the direction perpendicular to the substrate.

20. The display device according to claim 19, wherein the display region is further provided with a plurality of second connection lines, the second connection lines and the first connection lines are intersected, the second connection lines comprise respective second entity portions and respective second dummy portions, each of the second entity portions and a corresponding one of the second dummy portions are spaced apart; the first entity portion is electrically connected to a corresponding one of the signal traces through a respective one of the second entity portions, each of the second dummy portions is electrically insulated from a corresponding one of the second entity portions, and each of second gaps is provided between a first end of a corresponding one of the second entity portions and a first end of a respective one of the second dummy portions;

wherein the display panel further comprises a third metal layer disposed on a side of the second metal layer which is away from the substrate, the second connection lines and the data lines are located in the third metal layer, and each of the second gaps overlaps a corresponding one of the reset signal connection lines in the direction perpendicular to the substrate.

* * * * *